(12) United States Patent
Nagaya

(10) Patent No.: US 6,376,881 B1
(45) Date of Patent: *Apr. 23, 2002

(54) PROTECTIVE ELEMENT FORMED IN AN SOI SUBSTRATE FOR PREVENTING A BREAKDOWN IN AN OXIDE FILM LOCATED BELOW A DIFFUSED RESISTOR

(75) Inventor: Masafumi Nagaya, Miyazaki (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/527,018

(22) Filed: Mar. 16, 2000

(30) Foreign Application Priority Data

Nov. 18, 1999 (JP) .............................. 11-327835

(51) Int. Cl.[7] .............................................. H01L 23/62
(52) U.S. Cl. ..................... 257/355; 257/356; 257/358; 257/360
(58) Field of Search ................................ 257/324, 355, 257/356, 357, 358, 359, 360, 363, 546, 536

(56) References Cited

U.S. PATENT DOCUMENTS

| 5,786,616 A | * | 7/1998 | Fukumoto et al. | .......... 257/358 |
|---|---|---|---|---|
| 5,869,872 A | * | 2/1999 | Asai et al. | ................... 257/360 |
| 5,903,184 A |   | 5/1999 | Hiraga |   |
| 6,074,899 A | * | 6/2000 | Voldman | ..................... 438/155 |
| 6,172,403 B1 | * | 1/2001 | Chen | ........................... 257/355 |

FOREIGN PATENT DOCUMENTS

| JP | 7-66370 |   | 3/1995 |
|---|---|---|---|
| JP | 8-88323 |   | 4/1996 |
| JP | 408181219 A | * | 7/1996 |
| JP | 9-172144 |   | 6/1997 |
| JP | 9-289323 |   | 11/1997 |
| JP | 411261010 A | * | 9/1999 |
| JP | 11-284128 |   | 10/1999 |

* cited by examiner

*Primary Examiner*—Olik Chaudhuri
*Assistant Examiner*—Hoai Pham
(74) *Attorney, Agent, or Firm*—Venable; Robert J. Frank; Michael A. Sartori

(57) ABSTRACT

A semiconductor device according to the invention of the present application comprises a first semiconductor layer, a first insulating layer formed over the first semiconductor layer, a second semiconductor layer formed over the insulating layer, a protective element formed over the second semiconductor layer, an electrode pad, and a plurality of series-connected through holes for connecting the electrode pad and the protective element. Thus, a surge voltage applied across a diffused resistor can be lightened and hence an oxide film placed below the diffused resistor can be prevented from destruction.

24 Claims, 2 Drawing Sheets

PROTECTIVE ELEMENT FORMED IN AN SOI SUBSTRATE FOR PREVENTING A BREAKDOWN IN AN OXIDE FILM LOCATED BELOW A DIFFUSED RESISTOR

BACKGROUND OF THE INVENTION

1. Field of the Invention

The present invention relates to a semiconductor device.

2. Description of the Related Art

In a semiconductor integrated circuit wherein an integrated circuit is formed over a semiconductor substrate, a protective element has heretofore been provided between an electrode pad for swapping signals with an external device and an internal circuit. When a surge is externally inputted to the electrode pad, the protective element can lighten the surge so as to protect the internal circuit.

SUMMARY OF THE INVENTION

With the foregoing in view, it is therefore an object of the present invention to provide a semiconductor device suitable for application to a protective element formed in an SOI substrate and capable of preventing a breakdown in an oxide film located below a diffused resistor which constitutes the protective element.

There is provided a semiconductor device according to the present invention, for achieving the above object, which comprises a first semiconductor layer, a first insulating layer formed over the first semiconductor layer, a second semiconductor layer formed over the insulating layer, a protective element formed over the second semiconductor layer, an electrode pad, and a plurality of series-connected through holes for connecting the electrode pad and the protective element.

BRIEF DESCRIPTION OF THE DRAWINGS

While the specification concludes with claims particularly pointing out and distinctly claiming the subject matter which is regarded as the invention, it is believed that the invention, the objects and features and advantages thereof will be better understood from the following description taken in connection with the accompanying drawings in which:

DETAILED DESCRIPTION OF THE PREFERRED EMBODIMENTS

Preferred embodiment of the present invention will hereinafter be described in details with reference to the accompanying drawings.

Figure 1:
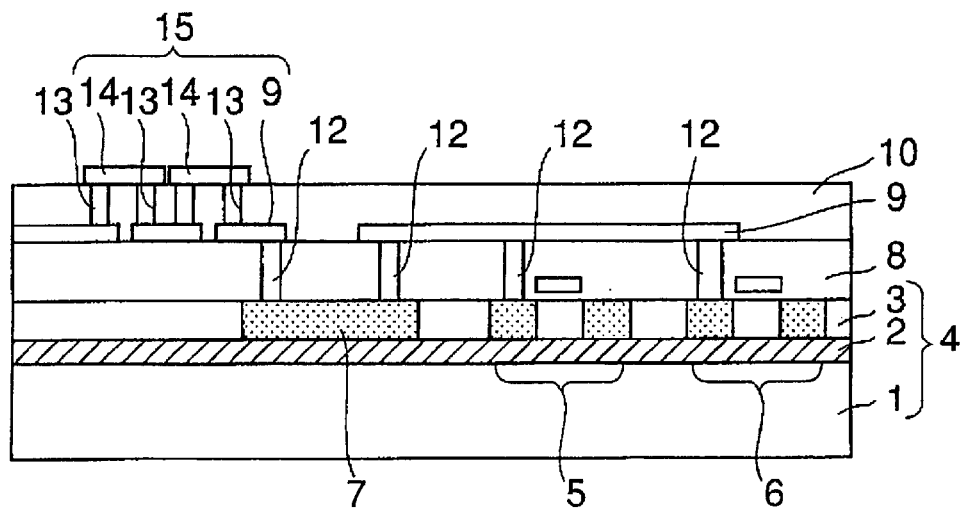
FIG. 1 is a cross-sectional view showing a first embodiment of the present invention.
Figure 2:
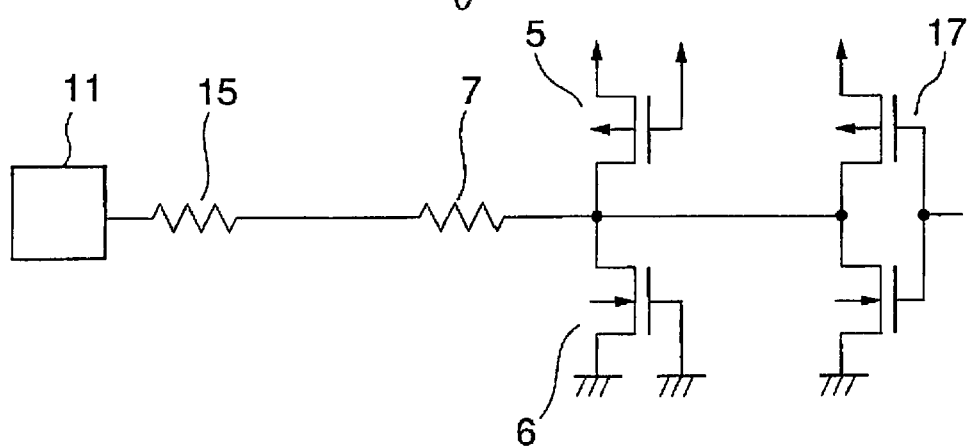
FIG. 2 is an equivalent circuit diagram showing the first embodiment of the present invention.
Figure 3:
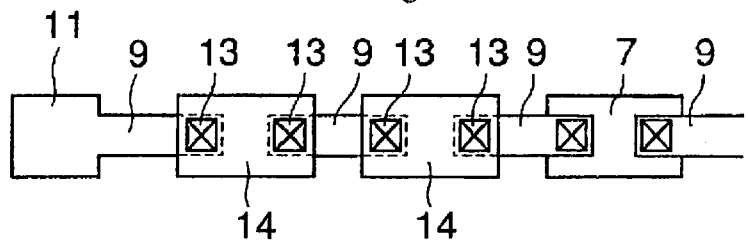
FIG. 3 is a layout view depicting resistance means employed in the first embodiment of the present invention.

FIG. 1 is a cross-sectional view of a protective element or device portion according to a first embodiment of the present invention, FIG. 2 is a circuit diagram of the protective element portion, and FIG. 3 is a pattern diagram of a resistive portion, respectively.

The first embodiment of the present invention will hereinafter be explained using these drawings.

FIG. 1 shows an example in which the present invention is applied to a protective element of an output circuit part. A protective element formed in an SOI substrate 4 is disclosed herein. The SOI substrate 4 is formed as follows: An oxygen ion is first implanted in the entire surface of a silicon substrate at a predetermined depth thereof and the silicon substrate is annealed, whereby a silicon oxide layer 2 is formed at a predetermined depth. Thus, the silicon substrate is separated into a silicon substrate 1 and a silicon layer 3 by the silicon oxide layer 2 corresponding to an insulating layer.

A method of forming another SOI substrate is as follows: Two silicon substrates each having an oxide film formed thereon are prepared and the surfaces of the oxide films are bonded to each other. Thereafter, one of the silicon substrates is polished. The polished surface thereof can be also used as the silicon layer 3.

A PMOS transistor 5, an NMOS transistor 6 and a diffused resistor 7 are formed within the silicon layer 3 of the SOI substrate. P type source/drain diffused layers for the PMOS transistor 5, which are formed within the silicon layer 3, N type source/drain diffused layers for the NMOS transistor 6, which are formed within the silicon layer 3, and the diffused resistor 7 are respectively formed up to a depth at which they contact the silicon oxide layer 2.

Further, the PMOS transistor 5, the NMOS transistor 6 and the diffused resistor 7 are respectively electrically insulated from one another by an unillustrated element isolation region. As the element isolation region, for example, a thick oxide film is used which extends from the surface of the silicon layer 3 to the silicon oxide film 2.

An insulating layer 8 is formed over the silicon layer 3 in which these PMOS transistor 5, NMOS transistor 6 and diffused layer 7 are formed. Each of first layer metal interconnections 9 comprised of, for example, an aluminum alloy is formed over the insulating layer 8.

One diffused layer for the PMOS transistor and the gate of the PMOS transistor are electrically connected to the first layer metal interconnection supplied with a source potential via an unillustrated through hole defined in the insulating layer 8, whereas the other diffused layer thereof is electrically connected to one end of the diffused resistor 7 via through holes 12 defined in the insulating layer 8 and the first metal interconnection.

One diffused layer for the NMOS transistor and the gate of the NMOS transistor are electrically connected to the first layer metal interconnection supplied with a ground potential via an unillustrated through hole defined in the insulating layer 8, whereas the other diffused layer thereof is electrically connected to one end of the diffused resistor 7 via contact holes 12 defined in the insulating layer 8 and the first metal interconnection.

The other end of the diffused resistor 7 is electrically connected to one end of resistive means 15 via its corresponding through hole 12 defined in the insulating layer 8.

Second layer metal interconnections 14 each comprised of, for example, an aluminum alloy are formed over their corresponding first layer metal interconnections 9 through an interlayer dielectric 10. A plurality of through holes 13 are defined in the interlayer dielectric 10. Tungsten is embedded in the through holes. The first layer metal interconnections 9 and the second layer metal interconnections 14 are electrically connected to one another through the tungsten embedded in the through holes 13. The plurality of through holes 13 are series-connected between an electrode pad 11 and the diffused resistor 7, and their resistance values can be set according to the number of the through holes 13.

The plurality of through holes series-connected in this way have predetermined resistance values respectively. In the first embodiment, the plurality of series-connected through holes are used as the resistive means 15.

The resistance value of the resistive means is as follows: Assuming that, for example, the diameter of each through hole is defined as 0.5 μm, the height thereof is defined as 0.8 μm and a resistance value per through hole is defined as 0.8 Ω, the resistance value of the resistive means 15 results in 100 Ω when 375 stages are connected in parallel combinations of the three through holes. When the resistance value of the diffused resistor is defined as 25 Ω, a voltage applied across the diffused resistor 7, of a surge voltage inputted to the electrode pad 11 can be reduced to ⅕.

It is desirable that the resistive means 15 is set higher than the diffused resistor 7 in resistance to diffuse the surge voltage inputted from the electrode pad into the resistive means 15 and the diffused resistor 7 and sufficiently reduce the voltage applied to the diffused resistor 7 in this way.

Owing to such a construction, a surge in the surge voltage inputted to the electrode pad 11 can be absorbed by supplying electric charges to the PMOS transistor 5 and the NMOS transistor 6 while the time required for the surge to rise is being delayed by the resistive means 15, the diffused resistor 7 and the capacities of the PMOS transistor 5 and the NMOS transistor 6. Thus, an unillustrated internal circuit connected through an output buffer 17 can be protected. Further, the surge voltage applied across the diffused resistor 7 can be lowered and the oxide film 2 placed below the diffused resistor 7 can be prevented from breaking down.

The present embodiment has been described with the protective element of the output circuit as an example. However, the present invention can be applied even to an input protective element.

Figure 4:
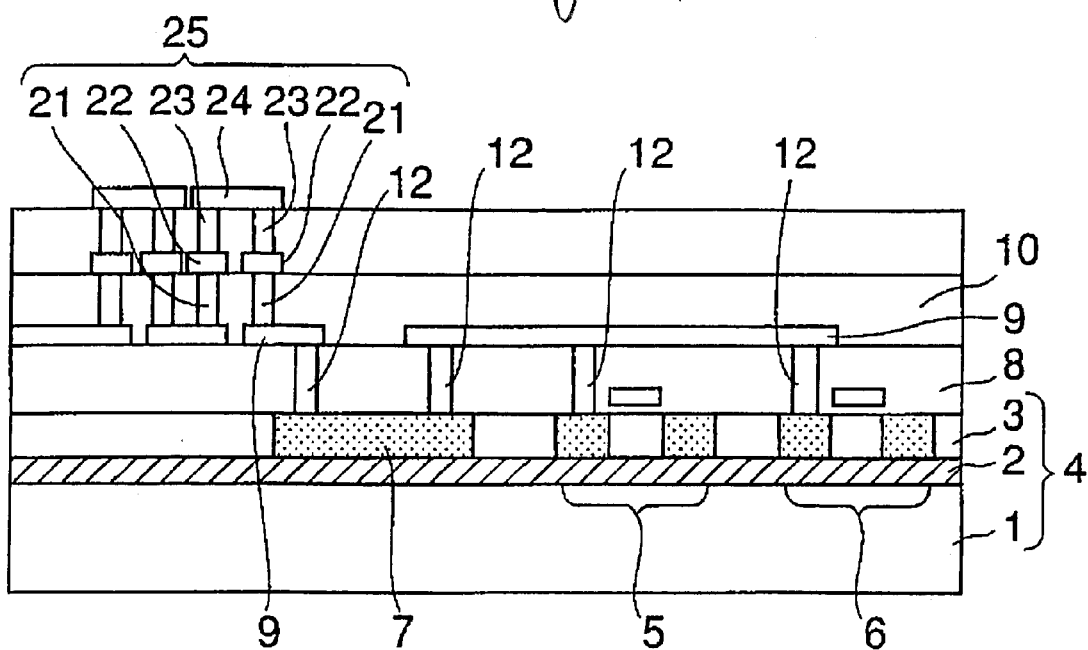
FIG. 4 is a cross-sectional view showing a second embodiment of the present invention.

A second embodiment of the present invention will next be described with reference to FIG. 4. The same elements of structures as those employed in the first embodiment are identified by the same reference numerals and the description thereof will therefore be omitted.

In the second embodiment, a through hole 21 for electrically connecting a first layer metal interconnection 9 and a second layer metal interconnection 22 and a through hole 23 for electrically connecting the second layer metal interconnection 22 and a third layer metal interconnection 24 are series-connected to each other. Further, the through hole 21 and the through hole 23 are connected in series in plural form to thereby form resistive means 25.

In a manner similar to the first embodiment even in the case of the present embodiment, the aluminum alloy is used for the first layer metal interconnections 9, second layer metal interconnections 22 and third layer metal interconnections 24, and the tungsten is used as a metal to be embedded in the through holes 22 and 23, respectively.

Owing to the use of the through holes series-connected between the first layer, second layer and third layer metal interconnections as the resistors in this way, the resistive means can be formed in a less area as compared with the first embodiment.

Figure 5:
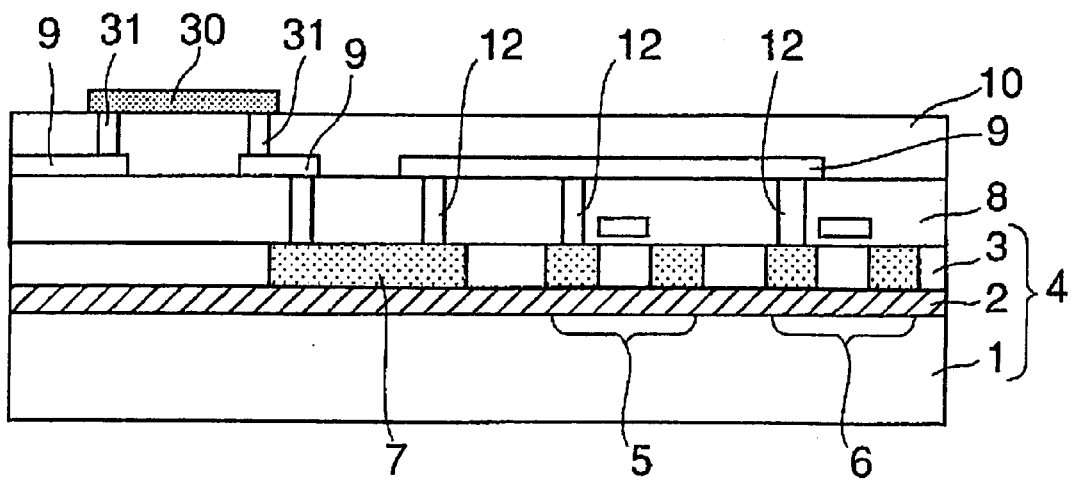
FIG. 5 is a cross-sectional view illustrating a third embodiment of the present invention.

A third embodiment of the present invention will next be explained with reference to FIG. 5. Incidentally, the same elements of structure as those employed in the first embodiment are identified by the same reference numerals and the description thereof will therefore be omitted.

In the third embodiment, a material such as poly-silicon, tungsten, which has a resistance value higher than the aluminum alloy, is used as resistive means 30.

The resistive means 30 is formed over an interlayer dielectric 10, and both ends thereof are respectively electrically connected to first layer metal interconnections 9 via through holes 31. It can be expected that owing to the use of the high-resistance poly-silicon or tungsten as the resistive means in this way, the equivalent resistance value can be obtained in a less area as compared with the resistive means 15 formed by using the through holes 13 in the first embodiment.

While the third embodiment has been described by the example in which the resistive means 30 is formed over the interlayer dielectric 10 formed over the first layer metal interconnections 9, the resistive means 30 can be also formed by using a wiring layer such as poly-silicon when the wiring layer such as the poly-silicon is formed below each first layer metal interconnection 9.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:
   a semiconductor substrate separated into a substrate region and an element forming region by an insulating layer formed to a predetermined depth, wherein said insulating layer separates the substrate region and the element forming region in a thickness direction of the semiconductor substrate;
   a protective element formed is said element forming region;
   an electrode pad; and
   a resistive element having both ends connected between said protective element and said electrode pad.

2. A semiconductor device according to claim 1, wherein said protective element includes a diffused resistor formed in said element forming region and said diffused resistor is in contact with said insulating layer.

3. A semiconductor device according to claim 2, wherein said resistive element includes a plurality of series-connected through holes.

4. A semiconductor device according to claim 3, wherein said resistive element has a resistance value higher than that of said diffused resistor.

5. A semiconductor device according to claim 1, wherein said resistive element comprises poly-silicon or tungsten formed in a layer different from that for said diffused resistor.

6. A semiconductor device according to claim 1, wherein in said resistive element comprises a plurality of series-connected through holes.

7. A semiconductor device according to claim 1, wherein said resistive element comprises a plurality of through holes coupling a first interconnection layer and a second interconnection layer.

8. A semiconductor device according to claim 1, wherein said resistive element comprises a first plurality of through holes coupling a first interconnection layer and a second interconnection layer and a second plurality of through holes coupling said second interconnection layer and a third interconnection layer.

9. A semiconductor device according to claim 1, wherein said resistive element comprises poly-silicon or tungsten coupled to a first interconnection layer.

10. A semiconductor device, comprising:

a first semiconductor layer;

a second semiconductor layer provided over said first semiconductor layer with a first insulating layer interposed therebetween;

a protective element formed in said second semiconductor layer and including a diffused region formed in contact with said insulating layer;

an electrode pad; and a plurality of series-connected through holes for connecting said electrode pad and said protective element.

11. A semiconductor device according to claim 10, wherein said plurality of through holes are defined between a first wiring layer formed over said second semiconductor layer and a second wiring layer formed over said first wiring layer with a second insulating layer interposed therebetween.

12. A semiconductor device according to claim 11, wherein said first wiring layer and said second wiring layer are connected to each other by a refractory metal embedded in the through holes.

13. A semiconductor device according to claim 10, wherein said protective element includes a protection transistor connected to an internal circuit and a diffused resistor formed in said second semiconductor layer and connected between said protection transistor and said through holes.

14. A semiconductor device, comprising:

a semiconductor substrate having a semiconductor region isolated from a base material by an insulating layer in a thickness direction of the semiconductor substrate;

a protective element formed in said semiconductor region and including a diffused resistor;

an interlayer insulating layer formed over said semiconductor region; and an electrode pad connected to said diffused resistor through a resistive element provided over said insulating layer.

15. A semiconductor device according to claim 14, wherein said resistive element is a plurality of series-connected through holes for connecting between a first wiring layer provided over said insulating layer and a second wiring layer formed over said first wiring layer with an interlayer dielectric interposed therebetween.

16. A semiconductor device according to claim 14, wherein said resistive element is formed of a conductive layer having resistivity higher than that of a wiring layer connected to said diffused resistor.

17. A semiconductor device, comprising:

a substrate having a semiconductor region provided on an insulating layer;

an internal circuit formed in said semiconductor region;

an electrode pad for connecting said internal circuit and an external device;

a protective element provided in said semiconductor region and provided between said electrode pad and said internal circuit; and resistive means formed in a layer different from said semiconductor region and connected between said electrode pad and said protective element.

18. A semiconductor device according to claim 17, wherein said protective element includes a diffused resistor formed in said semiconductor region and a diode formed in said semiconductor region.

19. A semiconductor device according to claim 18, wherein said diffused resistor is in contact with said insulating layer.

20. A semiconductor device according to claim 17, wherein said protective element includes a diffused resistor formed in said semiconductor region and at least one transistor formed in said semiconductor region and having one end connected to said diffused resistor and the other end and a gate electrode connected to a source potential.

21. A semiconductor device, comprising:

a protective element formed in a semiconductor layer, of an SOI substrate having the semiconductor layer provided on an insulating layer;

a first wiring layer formed over said insulating layer and electrically connected to said protective element;

an electrode pad formed over said insulating layer; and a resistive element having both ends connected between said first wiring layer and said electrode pad.

22. A semiconductor device according to claim 21, further including a second wiring layer formed over said first wiring layer with an interlayer dielectric interposed therebetween, and wherein said resistive element includes a plurality of through holes series-connected between said second wiring layer and said first wiring layer.

23. A semiconductor device according to claim 22, wherein said through holes have a refractory metal embedded therein, and said first wiring layer and said second wiring layer are connected to each other by the refractory metal.

24. A semiconductor device according to claim 21, wherein said resistive means comprises poly-silicon or tungsten formed in a layer different from that for said protective element.

* * * * *